US010305329B2

(12) United States Patent
Baarman et al.

(10) Patent No.: US 10,305,329 B2
(45) Date of Patent: *May 28, 2019

(54) INDUCTIVE POWER SUPPLY WITH DEVICE IDENTIFICATION

(71) Applicant: Philips IP Ventures B.V., Eindhoven (NL)

(72) Inventors: David W. Baarman, Fennville, MI (US); Scott A. Mollema, Rockford, MI (US)

(73) Assignee: PHILIPS IP VENTURES B.V., Eindhoven (NL)

(*) Notice: Subject to any disclaimer, the term of this patent is extended or adjusted under 35 U.S.C. 154(b) by 303 days.

This patent is subject to a terminal disclaimer.

(21) Appl. No.: 15/059,344

(22) Filed: Mar. 3, 2016

(65) Prior Publication Data

US 2016/0190873 A1 Jun. 30, 2016

Related U.S. Application Data

(63) Continuation of application No. 13/323,126, filed on Dec. 12, 2011, now Pat. No. 9,318,912, which is a
(Continued)

(51) Int. Cl.
*H02J 50/10* (2016.01)
*H02J 50/12* (2016.01)
(Continued)

(52) U.S. Cl.
CPC .............. *H02J 50/12* (2016.02); *G01R 31/40* (2013.01); *H02J 5/005* (2013.01); *H02J 7/025* (2013.01);
(Continued)

(58) Field of Classification Search
CPC .................................. H02J 50/10; H02J 50/12
See application file for complete search history.

(56) References Cited

U.S. PATENT DOCUMENTS 3,742,178 A  6/1973 Harnden, Jr.
3,761,668 A  9/1973 Harnden, Jr. et al.
(Continued)

FOREIGN PATENT DOCUMENTS

CA    2 319 344    8/1999
DE    44 39 095    5/1996
(Continued)

*Primary Examiner* — Fritz M Fleming

(57) ABSTRACT

An inductive power supply system to identify remote devices using unique identification frequencies. The system includes an AIPS and a tank circuit capable of inductively providing power to a remote device at different frequencies, and a sensor for sensing the reflected impedance of the remote device at tank circuit. The system further includes a plurality of different remote devices, each having a unique resonance frequency. In operation, the AIPS is capable of identifying the type of remote device present in the inductive field by applying power to a remote device at a plurality of unique identification frequencies until the remote device establishes resonance in response to one of the identification frequencies. The AIPS includes a controller that recognizes when resonance has been established by evaluating sensor data, which is representative of the reflected impedance of the remote device. Once the identity of a remote device is determined, the AIPS may pull operating parameters for the remove device from memory to ensure efficient operation and to assist in recognizing fault conditions.

50 Claims, 6 Drawing Sheets

Related U.S. Application Data continuation of application No. 13/166,187, filed on Jun. 22, 2011, now Pat. No. 8,097,984, which is a continuation of application No. 11/965,085, filed on Dec. 27, 2007, now Pat. No. 7,989,986, which is a continuation-in-part of application No. 11/388,142, filed on Mar. 23, 2006, now Pat. No. 7,355,150.

(60) Provisional application No. 60/883,127, filed on Jan. 2, 2007.

(51) Int. Cl.
    *H02J 17/00*     (2006.01)
    *H02J 7/02*     (2016.01)
    *H04B 5/00*     (2006.01)
    *H02J 50/90*     (2016.01)
    *G01R 31/40*     (2014.01)
    *H02J 5/00*     (2016.01)

(52) U.S. Cl.
CPC .............. *H02J 17/00* (2013.01); *H02J 50/10* (2016.02); *H02J 50/90* (2016.02); *H04B 5/0037* (2013.01)

(56) References Cited

U.S. PATENT DOCUMENTS

| | | |
|---|---|---|
| 4,351,996 A | 9/1982 | Kondo et al. |
| 5,648,008 A | 7/1997 | Barritt et al. |
| 6,080,975 A | 6/2000 | Kuse et al. |
| 6,184,651 B1 | 2/2001 | Fernandez et al. |
| 6,307,468 B1 | 10/2001 | Ward, Jr. |
| 6,320,169 B1 | 11/2001 | Clothier |
| 6,361,396 B1 | 3/2002 | Snyder et al. |
| 6,364,735 B1 | 4/2002 | Bristow et al. |
| 6,427,065 B1 | 7/2002 | Suga et al. |
| 6,501,054 B2 | 12/2002 | Engelmann et al. |
| 6,727,482 B2 | 4/2004 | Bassill et al. |
| 6,825,620 B2 | 11/2004 | Kuennen et al. |
| 6,844,702 B2 | 1/2005 | Giannopoulos et al. |
| 6,957,111 B2 | 10/2005 | Zhu et al. |
| 6,972,543 B1 | 12/2005 | Wells |
| 7,212,414 B2 | 5/2007 | Baarman |
| 7,355,150 B2 | 4/2008 | Baarman et al. |
| 7,443,057 B2 | 10/2008 | Nunally |
| 7,989,986 B2 | 8/2011 | Baarman et al. |
| 8,097,984 B2 | 1/2012 | Baarman et al. |
| 2001/0040507 A1 | 11/2001 | Eckstein |
| 2004/0004073 A1 | 1/2004 | Clothier |
| 2004/0130425 A1 | 7/2004 | Dayan et al. |
| 2004/0130915 A1 | 7/2004 | Baarman |
| 2004/0130916 A1 | 7/2004 | Baarman |
| 2004/0145342 A1 | 7/2004 | Lyon |
| 2004/0149736 A1 | 8/2004 | Clothier |
| 2005/0007067 A1 | 1/2005 | Baarman et al. |
| 2005/0017673 A1 | 1/2005 | Tsukamoto et al. |
| 2005/0067410 A1 | 3/2005 | Ring |
| 2005/0134213 A1 | 6/2005 | Takagi et al. |
| 2005/0151511 A1 | 7/2005 | Chary |
| 2005/0247696 A1 | 11/2005 | Clothier |
| 2007/0228833 A1 | 10/2007 | Stevens et al. |

FOREIGN PATENT DOCUMENTS

| | | |
|---|---|---|
| DE | 195 02 935 | 8/1996 |
| DE | 100 52 689 | 5/2002 |
| EP | 0 267 009 | 5/1988 |
| EP | 0 394 148 | 10/1990 |
| EP | 0 804 051 | 10/1997 |
| JP | H05-184471 | 7/1993 |
| JP | H06-020766 | 1/1994 |
| JP | H10-165294 | 6/1998 |
| JP | H10-215530 | 8/1998 |
| JP | H11-121159 | 4/1999 |
| JP | 2000-295796 | 10/2000 |
| JP | 2000-315571 | 11/2000 |
| JP | 2002-075615 | 3/2002 |
| JP | 2003-26331 | 1/2003 |
| JP | 2006-012862 | 1/2006 |
| JP | 2006-066149 | 3/2006 |
| JP | 2006-238548 | 9/2006 |
| WO | 97/34518 | 9/1997 |
| WO | 99/39751 | 8/1999 |
| WO | 01/19141 | 3/2001 |
| WO | 2005/018282 | 2/2005 |
| WO | 2005/072013 | 8/2005 |
| WO | 2006/001557 | 1/2006 |

| c1 | c2 | c3 | c4 | # | c1 | c2 | c3 | c4 | Capacitance | Frequency | Inductance |
|---|---|---|---|---|---|---|---|---|---|---|---|
| 8.2 | 6.8 | 3.3 | 2.2 | 0 | 0 | 0 | 0 | 0 | 0.0000 | 0 | 0.000000309 |
| 8.2 | 6.8 | 3.3 | 2.2 | 1 | 1 | 0 | 0 | 0 | 8.2000 | 100.03551 | 0.000000309 |
| 8.2 | 6.8 | 3.3 | 2.2 | 2 | 0 | 1 | 0 | 0 | 6.8000 | 109.85167 | 0.000000309 |
| 8.2 | 6.8 | 3.3 | 2.2 | 3 | 1 | 1 | 0 | 0 | 3.7173 | 148.57487 | 0.000000309 |
| 8.2 | 6.8 | 3.3 | 2.2 | 4 | 0 | 0 | 1 | 0 | 3.3000 | 157.69 | 0.000000309 |
| 8.2 | 6.8 | 3.3 | 2.2 | 5 | 1 | 0 | 1 | 0 | 2.3530 | 186.74378 | 0.000000309 |
| 8.2 | 6.8 | 3.3 | 2.2 | 6 | 0 | 1 | 1 | 0 | 2.2218 | 192.18097 | 0.000000309 |
| 8.2 | 6.8 | 3.3 | 2.2 | 7 | 1 | 1 | 1 | 0 | 1.7481 | 216.65786 | 0.000000309 |
| 8.2 | 6.8 | 3.3 | 2.2 | 8 | 0 | 0 | 0 | 1 | 2.2000 | 193.13002 | 0.000000309 |
| 8.2 | 6.8 | 3.3 | 2.2 | 9 | 1 | 0 | 0 | 1 | 1.7346 | 217.50013 | 0.000000309 |
| 8.2 | 6.8 | 3.3 | 2.2 | 10 | 0 | 1 | 0 | 1 | 1.6622 | 222.18594 | 0.000000309 |
| 8.2 | 6.8 | 3.3 | 2.2 | 11 | 1 | 1 | 0 | 1 | 1.3821 | 243.66718 | 0.000000309 |
| 8.2 | 6.8 | 3.3 | 2.2 | 12 | 0 | 0 | 1 | 1 | 1.3200 | 249.32978 | 0.000000309 |
| 8.2 | 6.8 | 3.3 | 2.2 | 13 | 1 | 0 | 1 | 1 | 1.1370 | 268.64929 | 0.000000309 |
| 8.2 | 6.8 | 3.3 | 2.2 | 14 | 0 | 1 | 1 | 1 | 1.1054 | 272.45684 | 0.000000309 |
| 8.2 | 6.8 | 3.3 | 2.2 | 15 | 1 | 1 | 1 | 1 | 0.9741 | 290.24099 | 0.000000309 |

FIG. 5

INDUCTIVE POWER SUPPLY WITH DEVICE IDENTIFICATION

The present invention relates to inductive power supply systems, and more particularly to an apparatus and method for inductive powering a variety of alternative remote devices.

There is a significant and continually increasing interest in wireless power supply systems, particularly in the field of consumer and business electronics, such as cell phones, music players, personal digital assistants and other remote devices. Wireless power supply systems provide a variety of benefits over conventional wired connections. Most notably, they eliminate the need for various charging cords and the need to repeatedly plug in and unplug electronic devices for recharging, thereby reducing cost and improving ease and convenience of use.

Systems for providing wireless power using the principles of electromagnetic inductive have been available for many years. Conventional systems have met with limited success as a result of practical limitations on pre-existing inductive technology. For example, to provide reasonably efficient operation, conventional inductive systems typically require close and precise alignment between the primary coil and the secondary coil, as well as a high degree of coordinated tuning between the electronics in the inductive power supply and the electronics in the remote device. These problems are complicated by the fact that different remote devices typically operate within different parameters. For example, one cell phone model is likely to have a different set of operating parameters than a different cell phone model, and even greater differences are likely to exist between remote devices of different types, such as a cell phone and a music player.

U.S. Pat. No. 6,825,620 to Kuennen et al discloses an inductive power supply system that has the ability to adjust its operation to correspond with the operating parameters of various loads. U.S. Pat. No. 6,825,620 to Kuennen et al, which is entitled "Inductively Coupled Ballast Circuit" and was issued on Nov. 30, 2004, is incorporated herein by reference. This inductive power supply system is capable of efficiently powering a wide variety of loads. Although a marked improvement over pre-existing systems, there is, in some applications, a desire for even greater efficiency over a broader range of products using a single inductive power supply system. In some applications, there exists a desire for a single inductive power supply that is capable of making a distinction between different loads, based upon various operating parameters of those loads. In other applications, there also exists a desire for a single inductive power supply system capable of more readily recognizing fault conditions over a broad range of remote devices.

SUMMARY OF THE INVENTION

The present invention provides an inductive power supply system and associated method in which an adaptive inductive power supply ("AIPS") identifies the remote device through reflected impedance, and controls operation as a function of the identity of the remote device. The present invention also provides the AIPS with the ability to assess fault conditions by recognizing when the secondary circuit is operating outside of normal operating conditions for the identified device.

In one embodiment, the present invention includes an AIPS having a controller capable of supplying power to the secondary circuit at various frequencies and a current sensor capable of directly or indirectly sensing the current in the tank circuit. In this embodiment, each remote device or type of remote device includes one or more resonant frequencies that individually or collective provide a signature that is unique to that device or type of remote device. For example, the identification frequency(ies) may uniquely identify a specific model of cell phone or a specific model of personal digital assistant. The system may also include a look-up table or other data collection containing operating information for one or more recognizable remote devices. This information can be used to establish operating parameters and recognize fault conditions.

In operation, the AIPS applies a short pulse of power to the secondary circuit at a frequency that is uniquely associated with a specific remote device. If the remote device has a resonant frequency at the frequency of the pulse, the remote device will draw a material amount of current, which will be reflected back into the tank circuit through reflected impedance. The controller will recognize the presence of the remote device when input from the current sensor shows the increased power draw. This permits the AIPS to recognize that a specific remote device is present and to obtain its operating parameters from the look-up table. Once the operating parameters have been retrieved, the AIPS can use the retrieved parameters to more efficiently power the device and to recognize that a fault condition has occurred when actual operating conditions fall outside the retrieved operating parameters.

In some applications, the remote device may inherently include a resonant frequency (or plurality of resonant frequencies) that is sufficiently unique to permit it to function as an identification frequency. In such application, the remote device will operate at resonance when the corresponding identification frequency is applied, thereby uniquely identifying the remote device.

In other applications, the remote device may not inherently have a resonant frequency at a frequency that will uniquely identify the remove device. With remote devices of this nature, the remote device can be provided with an identification capacitor that is selected to provide the remote device with a unique resonant frequency (or pattern of frequencies) that can be identified using an identification ping. In some applications, the main circuitry of the remote device may mask the identification capacitor. Accordingly, in some applications, the remote device may include a load delay circuit that isolates the main circuit of the remote device from the secondary coil and the identification capacitor for a sufficient period of time to allow resonance to be established by the identification capacitor and reflected back to the tank circuit.

In applications where the number of potential remote devices is large, a plurality of capacitors may be used to provide the remote devices with a plurality of resonant frequencies that collectively provide each remote device with a unique resonant "signature" in response to pings at different frequencies. For example, the use of two different capacitors can be used to provide three separate resonant frequencies—one for each capacitor individually and a third for the combination of the two capacitors. In one embodiment, the presence or absence of resonance at select frequencies can be used as the bits in a binary code that can unique identify a large number of remote devices with only a limited number of frequencies.

In one embodiment, the method generally includes the steps of applying a short pulse of power to the secondary circuit at an identification frequency, waiting a period of time and sensing the current in the tank circuit to determine if a remote device is present that has a resonant frequency at the frequency of the short pulse of power. If so, the remote device is identified and the operating parameters can be pulled from a lookup table or other memory device. If not, the AIPS can move to the next identification frequency and repeat the process. In some applications, a small delay may be implemented between each identification ping to allow the circuit to settle so that residual energy from one identification ping does not impact the remote device's response to the next identification ping. The system may repeatedly cycle through all of the possible identification frequencies until a remote device is positively identified.

In another embodiment, each remote device capable of being powered by an inductive power supply is provided with a capacitor with the same common resonant frequency. The inductive power supply is programmed to send a short power pulse at that single common resonant frequency. A response from the device, as described above, indicates that the device is capable of receiving power from the power supply.

In another embodiment, each device capable of being powered by an inductive power supply is equipped with a capacitor with a common resonant frequency, and one or more additional capacitors with unique secondary and/or tertiary resonant frequencies. According to this embodiment, the inductive power supply is programmed to send a short power pulse at the single common resonant frequency. When the supply senses a response at that frequency, the inductive power supply sends out additional short pulses at different frequencies, or over a range of frequencies. Depending on the responses at the various frequencies, the power supply is able to distinguish the type of device, and the specific device model.

Once a remote device has been identified, the AIPS can provide power to the remote device in accordance with the operating parameters pulled from memory. Additionally, the AIPS can use information from the lookup table to help identify fault conditions. For example, the lookup table can include minimum and maximum operating frequencies, as well as minimum and maximum current usage. If the current draw on the primary exceeds the maximum current retrieved from the lookup table, the AIPS will recognize a fault condition and take appropriate action, such as powering down the primary.

The present invention provides a simple and effective method and apparatus for identifying remote devices. The lookup table permits the AIPS to retrieve information regarding the remote devices, such as normal operating parameters. This allows the AIPS to more efficiently power the remote device and to more readily identify fault conditions. In applications where a single resonant frequency does not provide a sufficient number of unique identifications, each device may be provided with a pattern of identification frequencies. In applications where a remote device inherently includes a uniquely identifying resonant frequencies (or frequency pattern), the present invention requires no modification to the remote device. In applications where a remote device does not include an inherent uniquely identifying resonant frequency, the remote device may be provide with one or more identification capacitors that provide the remote device with an identification frequency or an identification frequency pattern. In another aspect, the present invention provides a set of standards from which a class of remote devices may be identified by predetermined identification frequencies. This permits intelligent operation of the AIPS for an essentially unlimited numbers of remote devices that fit within one of the predetermined classes of remote devices.

These and other objects, advantages, and features of the invention will be readily understood and appreciated by reference to the detailed description of the current embodiment and the drawings.

BRIEF DESCRIPTION OF THE DRAWINGS

FIG. 5 is a table showing various capacitor values and associated resonant frequencies available from select capacitor combinations.

DESCRIPTION OF THE CURRENT EMBODIMENT

Figure 1:
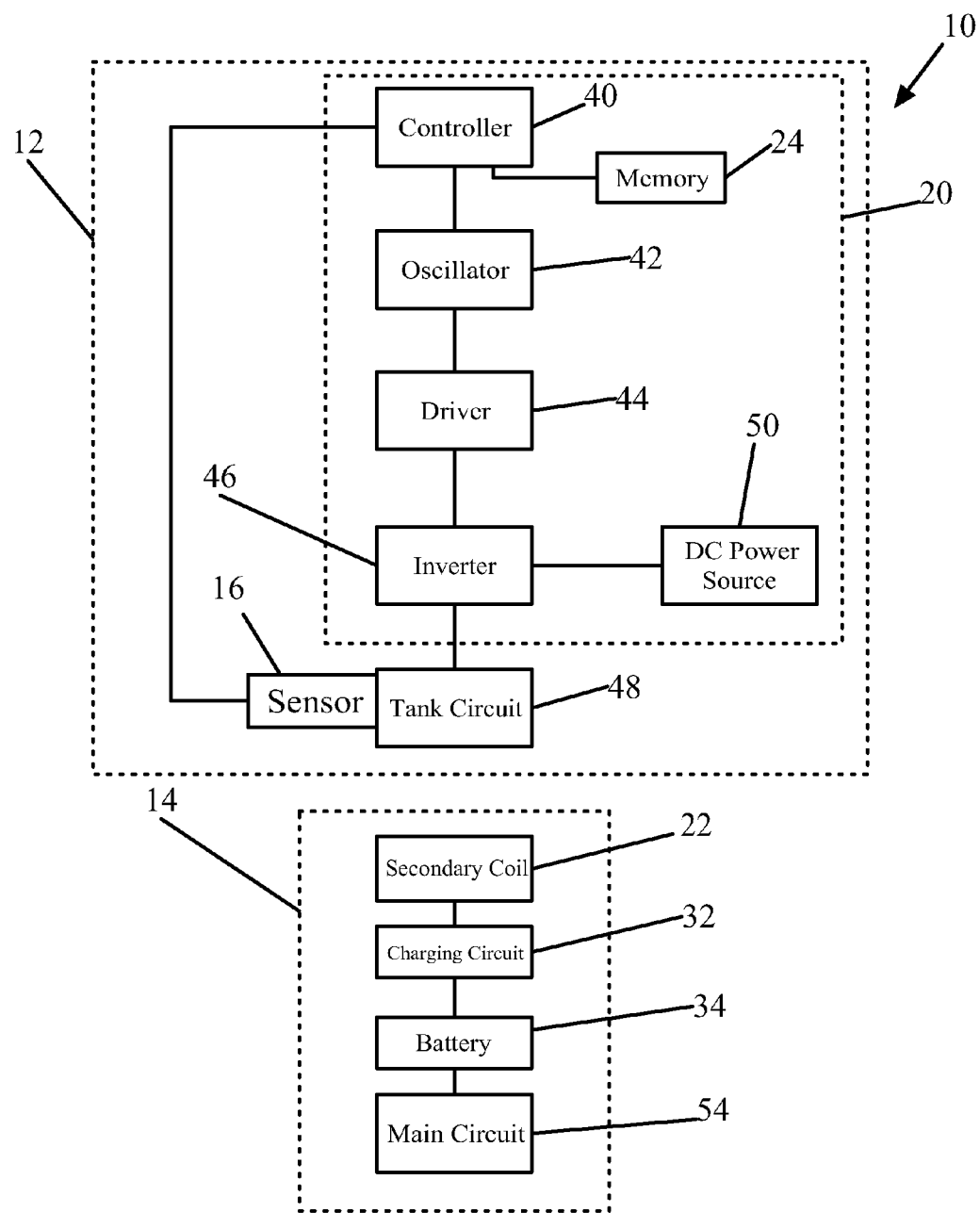
FIG. 1 is a schematic diagram of an inductive power supply system in accordance with an embodiment of the present invention.

An inductive power supply system in accordance with an embodiment of the present invention is shown in FIG. 1. The inductive power supply system 10 generally includes an adaptive inductive power supply ("AIPS") 12 and one of a plurality of remote devices 14. The AIPS 12 generally includes a tank circuit 48 with a primary coil 18 (See FIG. 2) capable of inductively transmitting power. The AIPS also includes a controller 20 for selectively controlling the frequency at which power is generated by the primary coil 18, and a sensor 16 capable of sensing reflected impedance from a remote device 14. The AIPS 12 is intended for use with one or more remote devices 14, each of which has a unique resonant frequency or unique pattern of resonant frequencies. In operation, the MPS 12 applies power to the primary 18 at an identification frequency and then evaluates the reflected impendence of the remote device 14 using the current sensor 16. If the remote device 14 has a resonant frequency at the identification frequency, then the AIPS 12 knows what type of remote device is inductively coupled to AIPS 12 and the AIPS 12 can recover operating parameters from a look-up table or other memory device. The recovered information can be used by the AIPS to provide efficient operation of the remote device and to identify fault conditions.

I. Adaptive Inductive Power Supply.

The present invention is suitable for use with a wide variety of adaptive inductive power supplies. As used herein, the term "adaptive inductive power supply" is intended to broadly include any inductive power supply capable of providing power at a plurality of different frequencies. For purposes of disclosure, the present invention is described in connection with a particular AIPS 12. The illustrated AIPS 12 is merely exemplary, however, and the present invention may be implemented with essentially any AIPS capable of providing inductive power at varying frequencies.

In the illustrated embodiment, the AIPS 12 generally includes a frequency controller 20 and a tank circuit 48. In operation, the frequency controller 20 applies power to the tank circuit 48 to generate a source of electromagnetic inductive power. The frequency controller 20 of the illustrated embodiment generally includes a microcontroller 40, an oscillator 42, a driver 44 and an inverter 46. The microcontroller 40 may be a microcontroller, such as a PIC18LF1320, or a more general purpose microprocessor. The oscillator 42 and driver 44 may be discrete components or they may be incorporated into the microcontroller 40, for example, in the embodiment illustrated in FIG. 2, the oscillator 42 is a module within the microcontroller 40. The frequency controller 20 may also include a low voltage power supply 26 for supplying low voltage power to the microprocessor 40 and the driver 44. In this embodiment, the various components of the frequency controller 20 collectively drive the tank circuit 48 at a frequency dictated by the microcontroller 40. More specifically, the microcontroller 40 sets the timing of the oscillator 42. In certain modes of operation, the microprocessor 40 may establish the operating frequency as a function of input from the current sensor 16. The oscillator 42, in turn, operates the driver 44 at the frequency established by the microcontroller 40. The driver 44 provides the signals necessary to operate the switches 47a-b within the inverter 46. As a result, the inverter 46 provides AC (alternating current) power to the tank circuit 48 from a source of DC (direct current) power 50.

In the illustrated embodiment, the current sensor 16 is a current transformer having its primary coil disposed in the tank circuit 48 and its secondary coil connected to the microcontroller 40. The AIPS may include conditioning circuitry 28 for conditioning the current transformer output before it is supplied to the microcontroller 40. Although the illustrated embodiment includes a current transformer for sensing the reflected impedance of the remote device, the AIPS 12 may include essentially any alternative type of sensor capable of providing information regarding reflected impedance from the remote device 14. Further, although the current sensor 16 of the illustrated embodiment is located in the tank circuit, the current sensor (or other reflected impedance sensor) can be located in essentially any location where it is capable of providing readings indicative of the presence or absence of resonance in the remote device.

In the illustrated embodiment, the AIPS further includes a lookup table 24 or other memory device capable of storing information relating to the operating parameters of a plurality of remote devices 14. The stored information may be used to permit the AIPS 12 to more efficiently power the remote device 14 and more readily recognize fault conditions. In some applications, the AIPS 12 may be intended for use with a specific set of remote devices 14. In these applications, the lookup table 24 includes the unique resonant frequency (or pattern of frequencies) for each remote device 14, along with the desired collection of associated information, such as maximum and minimum operating frequencies and current usage. The lookup table 24 may, however, include essentially any information that may be useful to the AIPS 12 in operating the remote device 14. For example, in applications where it is desirable to establish wireless communications with the remote device 14, the lookup table 24 may include information regarding the wireless communication protocol of the remote device 14.

The tank circuit 48 generally includes the primary coil 18 and a capacitor 52. The capacitance of capacitor 52 may be selected to balance the impedance of the primary coil 18 at anticipated operating parameters. The tank circuit 48 may be either a series resonant tank circuit (as shown) or a parallel resonant tank circuit (not shown). The present invention may be incorporated into the AIPS shown in U.S. Pat. No. 6,825,620, which as noted above is incorporated herein by reference. As another example, the present invention may be incorporated into the AIPS shown in U.S. Patent Application Publication US 2004/130916A1 to Baarman, which is entitled "Adapted Inductive Power Supply" and was published on Jul. 8, 2004 (U.S. Ser. No. 10/689,499, filed on Oct. 20, 2003), which is also incorporated herein by reference. Further, it may be desirable to use the present invention in connection with an AIPS capable of establishing wireless communications with the remote device, such as the AIPS shown in U.S. Patent Application Publication US 2004/130915A1 to Baarman, which is entitled "Adapted Inductive Power Supply with Communication" and was published on Jul. 8, 2004 (U.S. Ser. No. 10/689,148, filed on Oct. 20, 2003), which is incorporated herein by reference.

II. Remote Devices.

The present invention is intended for use with a wide variety of remote devices of varying designs and constructions. It is anticipated that these various remote devices will require power at varying frequency and will have different current requirements.

In some applications, the remote device may inherently include a unique resonant frequency or pattern of resonant frequencies. For example, a specific type of remote device may include a resonant frequency at 195 kHz. If none of the other remote devices to be identified by the AIPS include a resonant frequency at 195 kHz, then 195 kHz can operate as the identification frequency for this type of remote device. On the other hand, if the remote device does not include a resonant frequency that is unique among the set of remote devices that may need to be identified, then it may be possible to use the presence of a unique pattern of resonant frequencies to identify the remote device. For example, a remote device may have one resonant frequency at 195 kHz and another resonant frequency at 215 kHz. Even if other remote devices have a resonant frequency at 195 kHz or at 215 kHz, the combination of the two resonant frequencies in a single type of remote device may be sufficient to uniquely identify the type of remote device. If two resonant frequencies are not sufficient to uniquely identify a type of remote devices, then even more resonant frequencies may be considered until a unique pattern of identification frequencies emerges.

Figure 2:
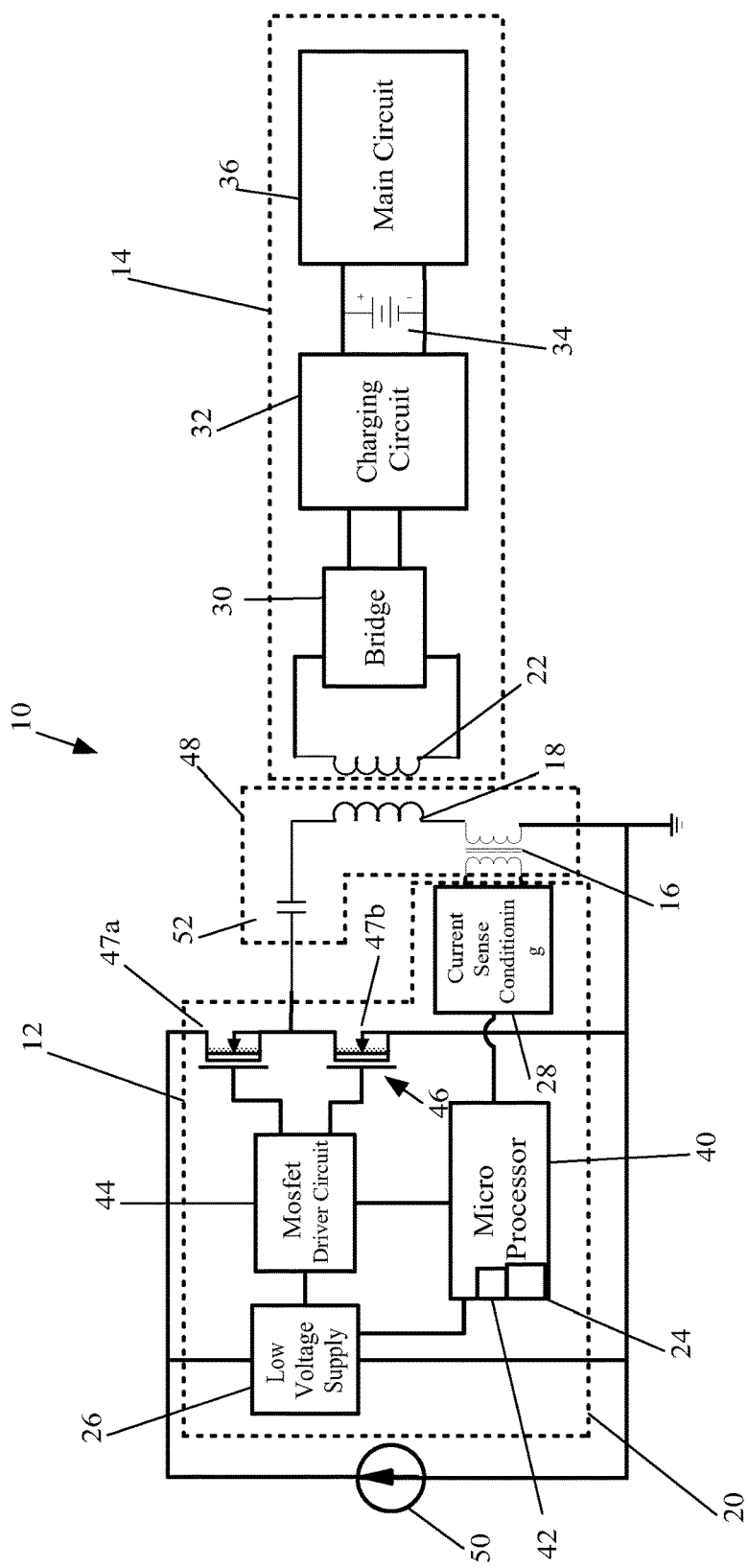
FIG. 2 is a circuit diagram of the inductive power supply system of one embodiment.

For purposes of disclosure, one embodiment of a remote device 14 having an inherent identification frequency is shown in FIG. 2. In the embodiment of FIG. 2, the remote device 14 generally includes a secondary 22 for receiving power from the AIPS 12, a bridge 30 (or other rectifier for converting AC power to DC), a charging circuit 32, a battery 34 and a main circuit 36. In operation, the bridge 30 converts the AC power generated in the secondary 22 to DC power, which is required for operation of charging circuit 32 in this embodiment. Charging circuits are well-known and are widely used with a variety of rechargeable electronic devices. If desired, the charging circuit 32 may be configured to both charge the battery 34 and/or power the remote device 14 (if the remote device 14 is powered on). Charge circuits capable of charging and/or powering an electronic device are well-known and therefore will not be described in detail. In some applications, the charging circuit 32 will be a part of the main circuit 36. In other applications, the charging circuit 32 will be a separate circuit, and may even be controlled by the AIPS 12, if desired. The term "main circuit" is used loosely to refer to the operating circuitry for the remote device 14.

Although the illustrated embodiment is described in connection with a battery-powered remote device, the present invention may alternatively be used to directly power a remote device by eliminating the battery 34 and charging circuit 32 and connecting the secondary 22 to the main circuit 36, for example, through appropriate power conditioning circuitry, which may include a transformer or rectifier (such as bridge 30).

Figure 3A:
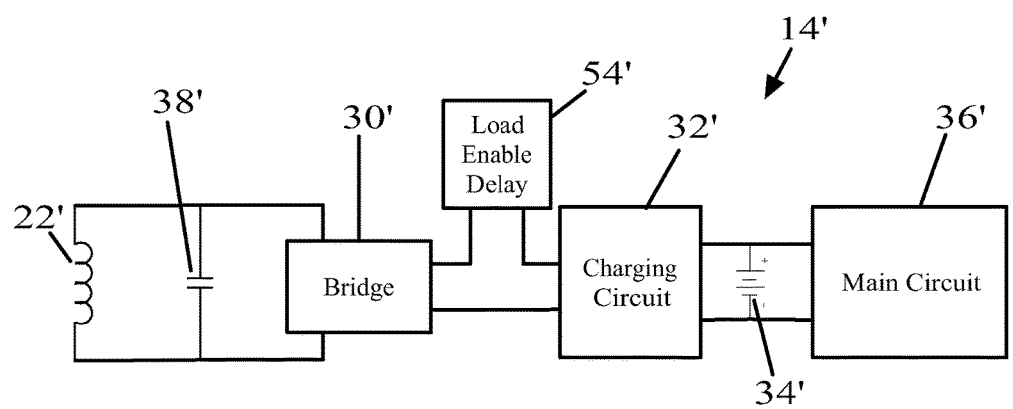
FIG. 3A is a circuit diagram of an alternative remote device having an identification capacitor.
Figure 4:
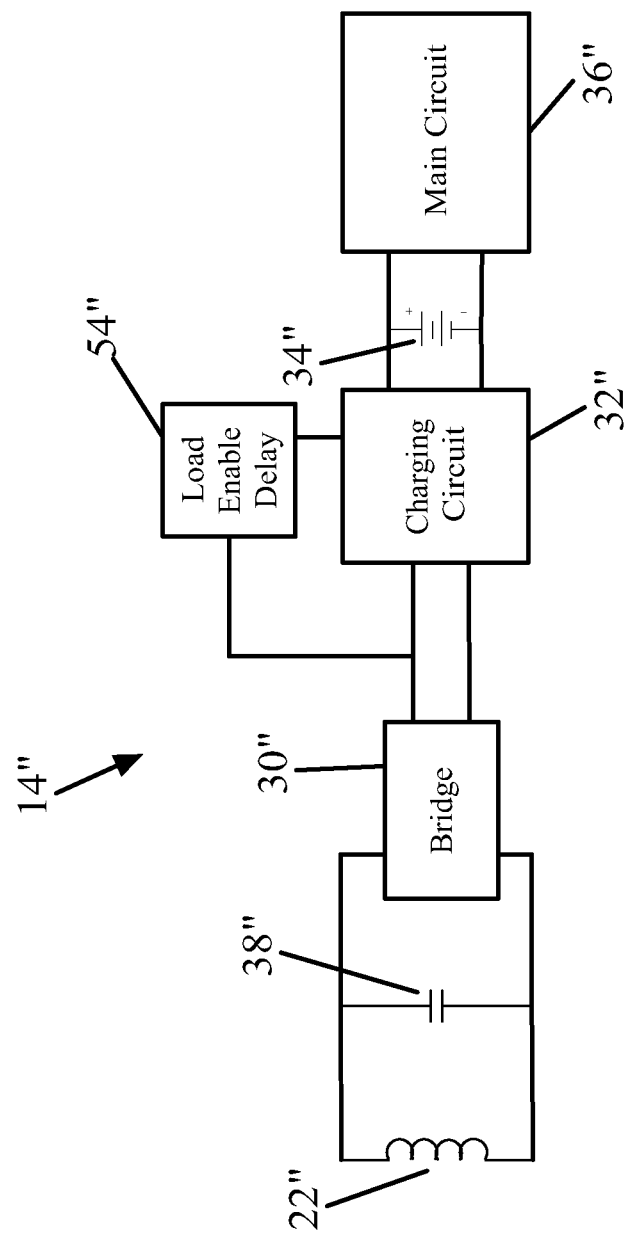
FIG. 4 is a circuit diagram of a second alternative remote device.

In another embodiment, a remote device may be provided with one or more identification capacitors that provide resonance at desired identification frequencies. Although useable with all remote devices, this embodiment is perhaps most useful with remote devices that do not have an inherent identification frequency or inherent identification pattern of frequencies. FIG. 3A shows a circuit diagram of an exemplary remote device 14' having an identification capacitor 38'. As shown in FIG. 3A, an identification capacitor 38' is connected in parallel across the secondary 22'. The identification capacitor 38' has a capacitance selected to establish resonance at the identification frequency. In this embodiment, it is possible that the charging circuit 32' and/or the main circuit 36' will mask the identification capacitor 38' making it difficult or impossible for the AIPS 12 to recognize the presence of the identification capacitor 38'. Accordingly, in this embodiment, the remote device 14' includes a load enable delay circuit 54' that prevents the charging circuit 32' and/or the main circuit 36' from receiving power for a period of time sufficient for the identification capacitor 38' to establish resonance and for that resonance to be conveyed to the AIPS 12 through reflected impedance. The load enable delay circuit 54' may include a simple timed switching circuit that connects the bridge 30' to the charging circuit 32' only after a sufficient period of time has lapsed. This embodiment is particularly well-suited for incorporating the present invention into remote devices already including a charging circuit. FIG. 4 shows an alternative embodiment intended primarily for use in incorporating the present invention into remote devices not already including charging circuitry or that include charging circuitry having a microprocessor with an enable input. In this embodiment, the load enable delay 54''' is connected to the "enable" input of the microprocessor in the charging circuitry 32'''. In this embodiment, the load enable delay 54''' does not enable the charging circuitry 32''' until a sufficient amount of time has passed for the AIPS 12 to recognize whether or not the identification capacitor 38''' has established resonance. Although described in connection with two specific embodiment, the load enable delay circuit may be essentially any circuitry capable of preventing the charging circuit and/or main circuit from masking the identification capacitor long enough for the AIPS 12 to recognize whether resonance has been established.

Figure 3B:
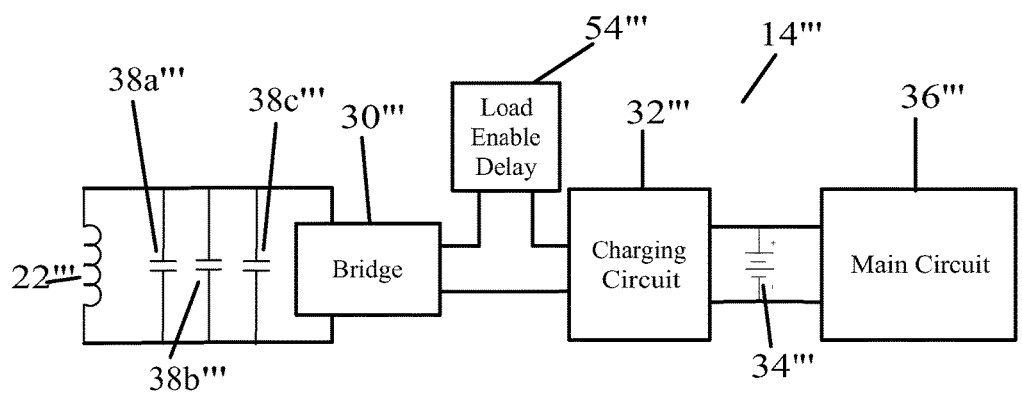
FIG. 3B is a circuit diagram of an alternative remote device having a plurality of identification capacitors.

In the embodiment of FIG. 3A, the remote device 14' includes only a single identification capacitor 38'. In the embodiment shown in FIG. 3B, the remote device 14'' is provided with three identification capacitors 38a-c'' connected in parallel to the load each providing resonance at a different frequency. In a similar manner, additional identification capacitors can be provided to establish even more additional resonant frequencies, if desired. For example, FIG. 5 is a table showing the resonance frequencies that may be provided using different combinations of four capacitors. The first four columns labeled C1-C4 list the capacitance (in microfarads) of four different capacitors. In this example, the capacitors are 8.2, 6.8, 3.3, and 2.2 microfarad capacitors. The capacitors used in this table or merely exemplary and are not intended to limit the scope of the present invention. The second four columns labeled C1-C4 identify the capacitors included that particular combination, using a "1" to represent the presence of a capacitor and a "0" to represent the absence of a capacitor. The column labeled "Capacitance" provides the combined capacitance of the capacitors in that particular combination. The column labeled "Frequency" provides the resonant frequency of the capacitor combination when the inductance is 0.000000309 as specified in the last column. For example, row four includes a "1" in the C1 and C2 columns to indicate that an 8.2 microfarad capacitor and a 6.8 microfarad capacitor are combined to provide a combined capacitance of 3.7173 microfarad, which will have a resonant frequency of roughly 148.5 kHz. In addition to the resonant frequency created by the combined capacitance of the two capacitors, the identification capacitors will also establish resonance at the individual capacitances of each capacitor in that combination. So, continuing with the row 4 example, the combined capacitors will also have a resonant frequency at roughly 100 kHz (the resonance frequency of the 8.2 microfarad capacitor) and at roughly 109.9 kHz (the resonance frequency of the 6.8 microfarad capacitor). As can be seen, the combination of 8.2 and 6.8 microfarad capacitors provides an identification frequency pattern with resonance at roughly 100 kHz, 109.9 kHz and 148.5 kHz.

The particular remote devices described above are merely exemplary as the present invention is well-suited for use with essentially any remote device having an identification frequency and capable of inductively receiving power within the limits of the AIPS.

III. Operation.

Figure 6:
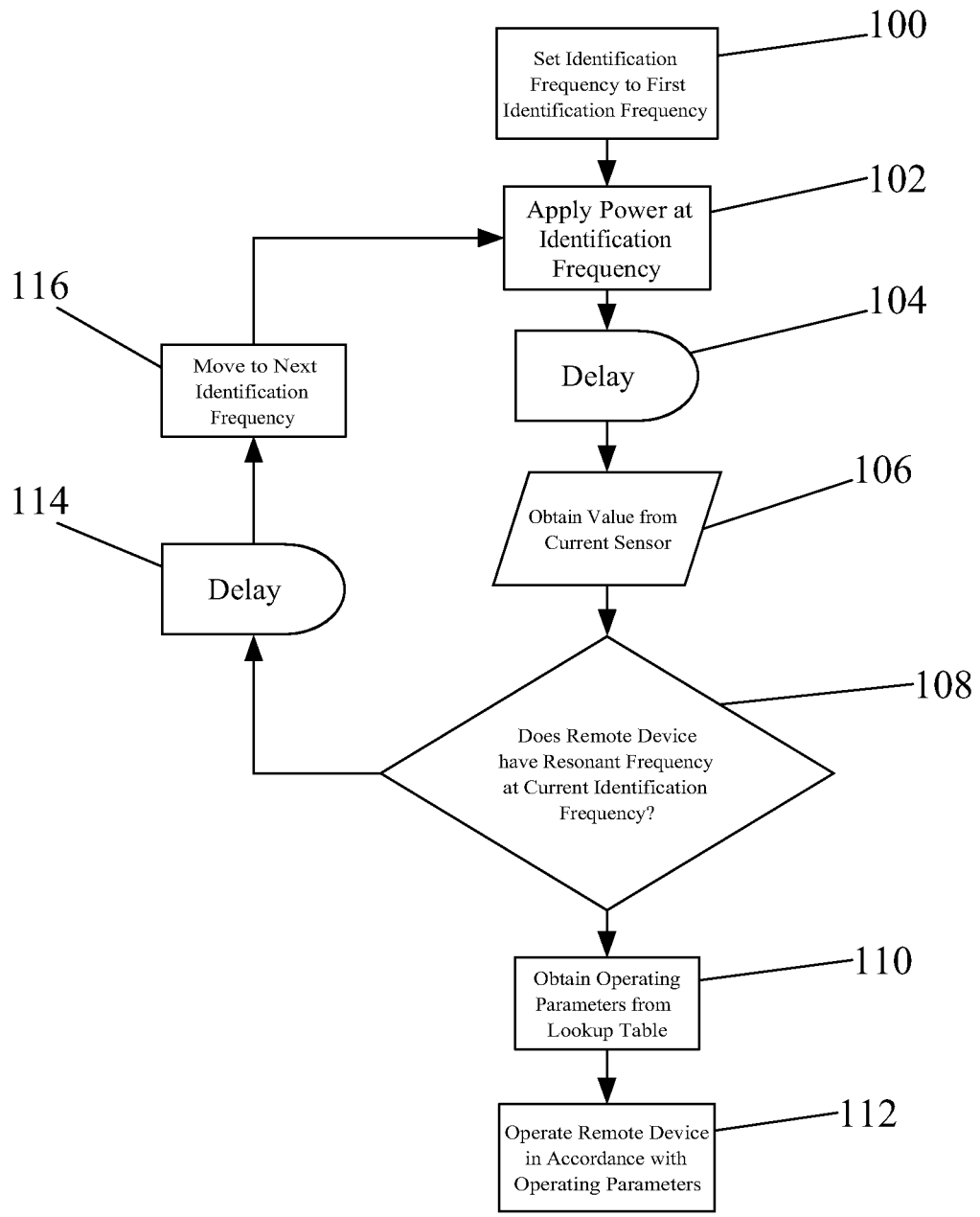
FIG. 6 is a flow chart showing the general steps of a method for identifying a remote device.

General operation of the system 10 is described in connection with FIG. 6. In this embodiment, the system 10 is configured to recognize one of a plurality of remote devices. Each remote device includes a single resonant frequency that is unique among the remote devices. Accordingly, the AIPS 12 can uniquely identify a remote device by cycling through each of the potential identification frequencies until a remote device is present that establishes resonance at one of the potential identification frequencies.

In the illustrated embodiment, the AIPS 12 is provided with data defining a plurality of potential identification frequencies. For example, a list or table of potential identification frequencies may be stored in onboard memory on the microcontroller 40. The identification process begins by setting 100 the identification frequency to the first frequency in the list. The AIPS 12 then applies 102 power to the tank circuit 48 at the identification frequency. The AIPS 12 continues to apply power to the tank circuit 48 for a period of delay 104. The delay period is selected to provide sufficient time for the remote device 14 to establish resonance and to generate sufficient reflected impedance in the tank circuit 48. The delay period may be a fixed period of time that remains constant throughout the identification process. The delay period may vary from application to application, but in the illustrated embodiment is approximately 6 microseconds. In some applications, a sufficient delay may be inherent in the system and therefore may not require the implementation of a separate deliberate delay step. If the remote device 14 includes a resonant frequency at the identification frequency, the remote device 14 will draw current and this increase in current draw will be reflected back into the tank circuit 48 by reflected impedance. After the delay 104 is complete, the microprocessor 40 obtains 106 input from the current sensor 16. As noted above, the output of the current sensor 16 may be conditioned using conditioning circuitry 28. The microprocessor 40 evaluates the input from the current sensor 16 to determine whether the remote device 14 has a resonant frequency at the current identification frequency. In this embodiment, the microprocessor 40 will conclude that a resonant frequency exists if the current sensor reading is above a threshold value. Typically, the threshold value for a specific application will be a value above the noise floor of that application plus an additional deadband. The amount of the deadband may vary from application to application.

If the microprocessor 40 determines that the remote device 14 does not include a resonant frequency at the current identification frequency, then the controller 20 prepares to apply to the next identification frequency to the tank circuit 48. More specifically, the microprocessor 40 enters a delay 114 for a relatively short period of time. The delay period is selected to provide sufficient time for the remote device 14 to settle and for the energy in the remote device 14 to sufficiently dissipate. The delay period may be a fixed period of time that remains constant from throughout the identification process. The settle delay period may vary from application to application, but in the illustrated embodiment is approximately 5 microseconds. In some applications, a sufficient delay may be inherent in the system and therefore may not require the implementation of a separate deliberate settle delay step. After the delay, the microprocessor 40 sets the identification frequency as the next frequency in the list of potential identification frequencies. The process then repeats beginning with the step of applying 102 power to the tank circuit 48 at the new identification frequency.

If the microprocessor 40 determines that the remote device 14 includes a resonant frequency at the current identification frequency, the microprocessor 40 will retrieve 110 the operating parameters from the lookup table 24 and will exit the remote device identification process. The microprocessor 40 may then operate 112 the remote device 14 using the operating parameters retrieved from lookup table 24. The lookup table 24 may include an anticipated operating frequency and may begin operation by applying power to the tank circuit 48 at the recalled operating frequency. The microprocessor 40 may also use maximum and minimum current draws values obtained from the lookup table to determine the presence of a fault condition. For example, if during operation the actual current draw sensed by the current sensor exceeds the maximum current draw or falls below the minimum current draw, the microprocessor 40 will conclude that a fault condition exists. The microprocessor 40 may be programmed to take remedial action if a fault condition is encountered. For example, the microprocessor 40 may be programmed to shut down the system if a fault condition arises. Alternatively, the microprocessor 40 may restart the identification process to determine if a different remote device 40 has been placed near the primary 18.

In the embodiment described above, the microprocessor 40 cycles through a list of potential identification frequencies in an effort to identify a remote device. As an alternative to cycling through a list, the AIPS 12 may be programmed to simply cycle through a range of frequencies using a specified step value. For example, by stepping from 100 kHz to 300 kHz in 5 kHz increments.

In another aspect, the present invention provides a mechanism for establishing standards for using frequency identification for remote devices. In this embodiment, unique identification frequencies can be specified for each type of remote device and for other identifying features. For example, the standards may specify a different identification frequency for each type of device (e.g. cell phone, personal digital assistant, may digital music player) and/or for each manufacturer (e.g. company name). In applications where a unique identification frequency is assigned to each manufacturer, the manufacturer may be permitted to add additional identification frequencies to specify model numbers and product types.

In an alternative method for establishing standards, identification frequencies can be established by the class of the remote device rather than the specific model type. For example, all devices operating within a given set of operating parameters can be assigned the same identification frequency (or identification frequency pattern). This alternative method is particularly well-suited for use in application where a plurality of remote devices of different types are capable of operating under the operating parameters set forth in a single record in the lookup table.

According to another embodiment, each device capable of being inductively powered or charged by an inductive power supply is provided with at least one common resonant frequency, and at least one unique frequency. For example, referring to the above embodiments and the figures, each device capable of being charged by AIPS 12 is provided with an 8.2 microfarad capacitor, providing the device with a primary identification resonant frequency of 100 kHz. AIPS 12 repeatedly sends out a pulse at approximately 100 kHz. If a device 14 with a resonant frequency of 100 kHz is placed within the field generated by AIPS 12, then AIPS proceeds with a sweep of additional frequencies to identify the type of device 14. According to one embodiment, the charging circuit of each individual battery type is provided with a second unique resonant frequency, or secondary identification frequency. For example, each lithium ion battery is further comprised of a capacitor or other circuitry to provide a secondary resonant frequency at 109.4 kHz; each nickel cadmium battery is provided with a capacitor or other circuitry to provide a secondary resonant frequency at 148.5 kHz. According to another embodiment, each battery may further equipped with a capacitor or other circuitry to provide a tertiary resonant frequency used to identify the individual manufacturer or supplier of that battery. For example, each inductively charged lithium ion battery manufactured or sold by vendor X is provided with one or more capacitors or other circuitry to provide a primary identification resonant frequency of 100 kHz, a secondary identification resonant frequency of 109.4 kHz, and a tertiary identification resonant frequency of 130 kHz. Each lithium ion battery manufactured or sold by vendor Y is provided with one or more capacitors or other circuitry to provide a primary identification resonant frequency of 100 kHz, a secondary identification resonant frequency of 109.4 kHz, and a tertiary identification resonant frequency of 140 kHz. According to another embodiment, an additional identification resonant frequency may be added to distinguish, for example, different types of inductively charged lithium ion batteries sold by vendor X or vendor Y. Such identification could allow AIPS to adjust the charging or power control not only according to the requirements of various load types as discussed above, but according to specific requirements of individual manufacturers or suppliers of those load types. It would be obvious that such identification strategies and protocols could be used to identify inductive loads that are not only powered by a rechargeable battery, but also to identify those loads that are directly inductively powered.

The standards discussed above rely on the assignment of a range of identification frequencies. The spacing between identification frequencies may vary from application to application depending of the resolution of the AIPS sensing the present of resonance during the identification process. For example, an AIPS with sufficient resolution to accurately recognize frequency differences of 5 kHz can use a separation of 5 kHz between identification frequencies (e.g. 250 kHz and 255 kHz). An AIPS with lower resolution may require greater separation between identification frequencies (e.g. 250 kHz and 260 kHz).

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to claim elements in the singular, for example, using the articles "a," "an," "the" or "said," is not to be construed as limiting the element to the singular.

The embodiments of the invention in which an exclusive property or privilege is claimed are defined as follows:

1. A device detection system for detecting one of a plurality of devices capable of receiving inductive power, the system comprising:
    an inductive power supply for transferring wireless power to a device having a power receiving coil configured for receiving operating wireless power;
    an inductive coil;
    processor circuitry for determining a device response from the device as said inductive coil is driven, said device response being pre-determined by resonant frequency signature circuitry of the device;
    a memory storing a frequency profile; and
    wherein said processor circuitry is configured to determine whether said device response from the device substantially corresponds to said frequency profile, and wherein said processor circuitry controls said inductive power supply in response to a determination that said device response from the device substantially corresponds to said frequency profile.

2. The system of claim 1 wherein the device detection system is capable of driving said inductive coil at a plurality of different operating frequencies, wherein the device response is a frequency response.

3. The system of claim 2 wherein said device response includes an output voltage at each of said plurality of different operating frequencies.

4. The system of claim 2 wherein said device response includes monitored current values.

5. The system of claim 1 wherein in response to determining said frequency profile from the device substantially corresponds to said device response, said processor circuitry retrieves information regarding the device from a database and controls said inductive power supply based on said information.

6. The system of claim 5 wherein said information includes an operating parameter.

7. The system of claim 1 wherein said resonant frequency signature circuitry includes an impedance element selected to provide the device with a predetermined resonant frequency signature.

8. The system of claim 7 wherein the predetermined resonant frequency signature includes one or more resonant frequencies different from a resonant frequency at which operating wireless power is transferred from the inductive power supply to the device.

9. The system of claim 7 wherein said impedance element includes a capacitance in parallel with the power receiving coil of the device.

10. A method for detection of a device capable of receiving inductive power, the method comprising:
    driving an inductive coil to transfer energy to a device having a power receiving coil;
    determining a device response from the device as the inductive coil is driven, the device response being generated at least in part by resonant frequency signature circuitry of the device;
    storing a frequency profile in memory;
    determining whether the device response of the device substantially corresponds to the frequency profile stored in memory; and
    controlling an inductive power supply in response to a determination that the device response from the device matches the frequency profile in memory.

11. The method of claim 10 including driving the inductive coil at a plurality of different operating frequencies in the presence of the device, wherein the device response is a frequency response.

12. The method of claim 11 wherein the frequency response includes an output voltage at each of the plurality of different driven operating frequencies.

13. The method of claim 11 wherein the frequency response includes current values.

14. The method of claim 10 including, in response to determining the device response of the device substantially corresponds to the frequency profile:
    retrieving information regarding the device from a database; and
    controlling the inductive power supply based on the information.

15. The method of claim 14 wherein the information includes an operating parameter.

16. The method of claim 14 wherein the resonant frequency signature circuitry includes an impedance element selected to provide the device with a predetermined resonant frequency signature.

17. The method of claim 16 wherein the predetermined resonant frequency signature includes one or more resonant frequencies different from a resonant frequency at which operating wireless power is transferred from the inductive power supply to the device.

18. The method of claim 16 wherein the impedance element includes a capacitance in parallel with the power receiving coil of the device.

19. A device detection apparatus for detecting one of a plurality of devices capable of receiving inductive power, the device detection apparatus comprising:
    an inductive power supply for transferring wireless power to a device having a power receiving coil configured for receiving operating wireless power;
    an inductive coil;
    processor circuitry for determining a device response from the device as said inductive coil is driven, said device response being predetermined by resonant frequency signature circuitry of the device;
    a memory storing a frequency signature; and
    wherein said processor circuitry is configured to determine whether said device response from the device substantially corresponds to said frequency signature, and wherein said processor circuitry controls said inductive power supply in response to a determination that said device response from the device substantially matches said frequency signature.

20. The apparatus of claim 19 wherein said processor circuitry is capable of directing said inductive power supply to drive said inductive coil at a plurality of different operating frequencies, wherein the device response is a frequency profile.

21. The apparatus of claim 20 wherein said frequency profile includes voltage values.

22. The apparatus of claim 20 wherein said frequency profile includes current values.

23. The apparatus of claim 19 wherein in response to determining said device response from the device substantially corresponds to said frequency signature, said processor circuitry retrieves information regarding the device from a database and controls said inductive power supply based on the information.

24. The apparatus of claim 23 wherein said information includes an operating parameter.

25. The apparatus of claim 19 wherein the resonant frequency signature circuitry of the device includes an impedance element selected to provide the device with a predetermined resonant frequency signature.

26. The apparatus of claim 25 wherein the predetermined resonant frequency signature of the device includes one or more resonant frequencies different from a resonant frequency at which operating wireless power is transferred from the inductive power supply to the device.

27. The apparatus of claim 25 wherein the impedance element of the device includes a capacitance in parallel with the power receiving coil of the device.

28. A method of detecting a known remote device, said method comprising:
  disposing a load in proximity to an inductive power supply, wherein the inductive power supply is configured for transferring wireless power to the load having a power receiving coil configured for receiving operating wireless power;
  applying power to an inductive coil to enable detection of the load in proximity to the inductive power supply;
  characterizing the load by obtaining a frequency response from the load, the frequency response being predetermined by resonant frequency signature circuitry of the load;
  determining whether the load is a known remote device based on the frequency response; and
  controlling the inductive power supply to supply operating wireless power in response to said determining the load is a known remote device.

29. The method of claim 28 wherein characterizing the load includes monitoring an inductive coil as power is applied to the inductive coil.

30. The method of claim 28 wherein said applying power includes applying power to the inductive coil at a plurality of different operating frequencies.

31. The method of claim 30 wherein the frequency response includes an output voltage at a plurality of different operating frequencies.

32. The method of claim 30 wherein the frequency response includes current values at a plurality of different operating frequencies.

33. The method of claim 28 including, in response to determining the load is the known remote device:
  retrieving information regarding the known remote device from a database; and
  controlling the inductive power supply based on the information.

34. The method of claim 33 wherein the information includes an operating parameter.

35. The method of claim 28 wherein the resonant frequency signature circuitry includes an impedance element selected to provide the load with a predetermined resonant frequency signature.

36. The method of claim 35 wherein the predetermined resonant frequency signature includes one or more resonant frequencies different from a resonant frequency at which operating wireless power is transferred from the inductive power supply to the load.

37. The method of claim 35 wherein said impedance element includes a capacitance in parallel with a power receiving coil of the load.

38. A detection device comprising:
  an inductive power supply for transferring wireless power to a load configured for receiving operating wireless power;
  wherein said detection device is capable of driving an inductive coil to enable detection of the load in proximity to said inductive power supply;
  processor circuitry for characterizing the load by obtaining a frequency response of the load as said inductive coil is driven, the frequency response being predetermined by resonant frequency signature circuitry of the load;
  a memory storing a frequency signature associated with the load; and
  wherein the processor circuitry detects the load based on a comparison between said frequency response and said frequency signature.

39. The detection device of claim 38 wherein the detection device is capable of driving said inductive coil at a plurality of different operating frequencies.

40. The detection device as claimed in claim 39 wherein said frequency response includes voltage values.

41. The detection device as claimed in claim 39 wherein said frequency response includes current values.

42. The detection device as claimed in claim 38 wherein said processor circuitry detects the load based on said frequency response substantially matching said frequency signature.

43. The detection device as claimed in claim 38 wherein in response to detecting said frequency response substantially matches said frequency signature, said processor circuitry retrieves information regarding the load from a database and controls said inductive power supply based on said information.

44. The detection device as claimed in claim 43 wherein said information includes an operating parameter.

45. The detection device as claimed in claim 38 wherein the resonant frequency signature circuitry includes an impedance element selected to provide the load with a predetermined resonant frequency signature.

46. The detection device as claimed in claim 45 wherein the predetermined resonant frequency signature includes one or more resonant frequencies different from a resonant frequency at which operating wireless power is transferred from the inductive power supply to the load.

47. The detection device as claimed in claim 45 wherein said impedance element includes a capacitance in parallel with a power receiving coil of the load.

48. A remote device for receiving wireless power from an inductive power supply, said remote device comprising:
  a secondary coil configured to receive a first wireless power at a power transfer frequency and a second wireless power at a predetermined identification frequency, wherein the first wireless power is configured to be utilized as operating wireless power and the second wireless power is configured to be utilized for device identification;

frequency signature circuitry including an identification capacitance in parallel to the secondary coil that is configured to identify a resonant frequency signature, the resonant frequency signature including one or more predetermined resonant identification frequencies different from the operating power transfer frequency, wherein the resonant frequency signature is configured to identify at least one of the remote device, a type of the remote device, a class of the remote device, or a manufacturer of the remote device; and wherein the frequency signature circuitry is configured to, in response to the remote device receiving wireless power at the resonant frequency signature, establish resonance at the one or more predetermined resonant identification frequencies which is conveyed through reflected impedance.

49. The remote device of claim 48 further comprising charging circuitry for charging a battery in the remote device with the operating wireless power.

50. The remote device of claim 48 further comprising power conditioning circuitry for directly powering a main circuit of the remote device with the operating wireless power.

* * * * *